United States Patent
Sekiya et al.

(10) Patent No.: US 7,696,010 B2
(45) Date of Patent: *Apr. 13, 2010

(54) WAFER DIVIDING METHOD

(75) Inventors: Kazuma Sekiya, Tokyo (JP); Masaru Nakamura, Tokyo (JP); Satoshi Kobayashi, Tokyo (JP)

(73) Assignee: Disco Corporation, Tokyo (JP)

( * ) Notice: Subject to any disclaimer, the term of this patent is extended or adjusted under 35 U.S.C. 154(b) by 559 days.

This patent is subject to a terminal disclaimer.

(21) Appl. No.: 11/639,209

(22) Filed: Dec. 15, 2006

(65) Prior Publication Data

US 2007/0141811 A1    Jun. 21, 2007

(30) Foreign Application Priority Data

Dec. 19, 2005   (JP)   ............................. 2005-364347

(51) Int. Cl.
*H01L 21/00* (2006.01)
(52) U.S. Cl. .................. 438/113; 438/114; 438/460; 438/461; 257/E21.599
(58) Field of Classification Search ................ 438/108, 438/110, 113, 114, 460, 462, 463, 464, 106, 438/461; 257/E21.599
See application file for complete search history.

(56) References Cited

U.S. PATENT DOCUMENTS 7,507,639 B2 *   3/2009   Nakamura .................. 438/463
2005/0170616 A1 *   8/2005   Murata et al. ................ 438/463
2005/0215033 A1 *   9/2005   Yamamoto et al. .......... 438/464
2006/0084239 A1 *   4/2006   Nagai et al. ................. 438/460

FOREIGN PATENT DOCUMENTS

JP    2002192370 A  *  7/2002
JP    3408805          3/2003

* cited by examiner

*Primary Examiner*—Brook Kebede
*Assistant Examiner*—Marvin Payen
(74) *Attorney, Agent, or Firm*—Smith, Gambrell & Russell, LLP

(57) ABSTRACT

A method of dividing a wafer having devices which are formed in a plurality of areas sectioned by a plurality of dividing lines formed in a lattice pattern on the front surface, into individual devices along the dividing lines, comprising: a deteriorated layer forming step for forming a deteriorated layer in the inside of the wafer along the dividing lines by applying a laser beam of a wavelength having permeability for the wafer along the dividing lines; a wafer supporting step for putting the rear surface of the wafer on the surface of an adhesive tape which is mounted on an annular frame and whose adhesive strength is reduced by applying ultraviolet radiation thereto; an adhesive strength reducing step for reducing the adhesive strength of the adhesive tape by applying ultraviolet radiation to the adhesive tape to which the wafer has been affixed; and a dividing step for dividing the wafer into individual devices along the dividing lines where the deteriorated layer has been formed by exerting external force to the wafer affixed to the adhesive tape whose adhesive strength has been reduced after the adhesive strength reducing step.

3 Claims, 9 Drawing Sheets

(a)

(b)

(a)

(b)

WAFER DIVIDING METHOD

FIELD OF THE INVENTION

The present invention relates to a method of dividing a wafer having a plurality of dividing lines which are formed in a lattice pattern on the front surface and devices which are formed in a plurality of areas sectioned by the plurality of dividing lines into individual chips along the dividing lines.

DESCRIPTION OF THE PRIOR ART

In the production process of a semiconductor device, a plurality of areas are sectioned by dividing lines called "streets" which are arranged in a lattice pattern on the front surface of a substantially disk-like semiconductor wafer, and a device such as IC or LSI is formed in each of the sectioned areas. Individual semiconductor chips are manufactured by cutting this semiconductor wafer along the dividing lines to divide it into the areas having device formed therein. An optical device wafer comprising a gallium nitride-based compound semiconductor on the front surface of a sapphire substrate is also cut along predetermined dividing lines to be divided into individual optical devices such as light emitting diodes or laser diodes which are widely used in electric appliances.

As a means of dividing a wafer such as the above semiconductor wafer or optical device wafer along the dividing lines, Japanese Patent No. 3408805 discloses a laser processing method for applying a pulse laser beam of a wavelength having permeability for the wafer with its focal point set to the inside of the area to be divided. In the dividing method making use of this laser processing technique, the wafer is divided into individual devices by applying a pulse laser beam of an infrared range having permeability for the wafer with its focal point set to the inside from one side of the wafer, to continuously form a deteriorated layer in the inside of the wafer along the dividing lines and exerting external force along the dividing lines whose strength has been reduced by the formation of the deteriorated layers.

The wafer such as a semiconductor wafer is divided along the dividing lines in a state of the rear surface of the wafer being put on the surface of an adhesive tape mounted on an annular frame so that the obtained devices do not fall apart.

When external force is applied to the wafer where the deteriorated layer has been formed along the dividing lines to divide it into individual devices, a problem arises that the wafer bounces by the influence of a soft adhesive applied to the adhesive tape, thereby producing fine cracks (chippings) on the rear surfaces of devices and reducing the qualities of the devices. When the wafer is divided along the dividing lines where the deteriorated layer has been formed, there is another problem in that dust is scattered and adheres onto the surfaces of devices, thereby reducing the qualities of the devices.

SUMMARY OF THE INVENTION

It is an object of the present invention to provide a wafer dividing method capable of dividing a wafer without producing fine cracks (chippings) on the rear surfaces of devices.

To attain the above object, according to a first aspect of the present invention, there is provided a method of dividing a wafer having a plurality of dividing lines which are formed in a lattice pattern on the front surface and devices which are formed in a plurality of areas sectioned by the plurality of dividing lines, into individual devices along the dividing lines, comprising:

a deteriorated layer forming step for forming a deteriorated layer in the inside of the wafer along the dividing lines by applying a laser beam of a wavelength having permeability for the wafer along the dividing lines;

a wafer supporting step for putting the rear surface of the wafer on the surface of an adhesive tape which is mounted on an annular frame and whose adhesive strength is reduced by applying ultraviolet radiation thereto;

an adhesive strength reducing step for reducing the adhesive strength of the adhesive tape by applying ultraviolet radiation to the adhesive tape affixing to the wafer where the deteriorated layer has been formed along the dividing lines; and a dividing step for dividing the wafer into individual devices along the dividing lines where the deteriorated layer has been formed by exerting external force to the wafer affixed to the adhesive tape whose adhesive strength has been reduced after the adhesive strength reducing step.

According to a second aspect of the present invention, there is provided a method of dividing a wafer having a plurality of dividing lines which are formed in a lattice pattern on the front surface and devices which are formed in a plurality of areas sectioned by the plurality of dividing lines, into individual devices along the dividing lines, comprising:

a deteriorated layer forming step for forming a deteriorated layer in the inside of the wafer along the dividing lines by applying a laser beam of a wavelength having permeability for the wafer along the dividing lines;

a wafer supporting step for putting the rear surface of the wafer on the surface of an adhesive tape which is mounted on an annular frame;

a protective tape affixing step for affixing a protective tape to the front surface of the wafer before or after the wafer supporting step; and a dividing step for dividing the wafer into individual devices along the dividing lines where the deteriorated layer has been formed by exerting external force to the wafer affixed to the adhesive tape.

According to a third aspect of the present invention, there is provided a method of dividing a wafer having a plurality of dividing lines which are formed in a lattice pattern on the front surface and devices which are formed in a plurality of areas sectioned by the plurality of dividing lines, into individual devices along the dividing lines, comprising:

a deteriorated layer forming step for forming a deteriorated layer in the inside of the wafer along the dividing lines by applying a laser beam of a wavelength having permeability for the wafer along the dividing lines;

a wafer supporting step for putting the rear surface of the wafer on the surface of an adhesive tape which is mounted on an annular frame and whose adhesive strength is reduced by applying ultraviolet radiation thereto;

a protective tape affixing step for affixing a protective tape to the front surface of the wafer before or after the wafer supporting step;

an adhesive strength reducing step for reducing the adhesive strength of the adhesive tape by applying ultraviolet radiation to the adhesive tape affixing to the wafer where the deteriorated layer has been formed along the dividing lines; and a diving step for dividing the wafer into individual devices along the dividing lines where the deteriorated layer has been formed by exerting external force to the wafer affixed to the adhesive tape whose adhesive strength has been reduced after the adhesive strength reducing step.

Since the adhesive of the adhesive tape is cured by carrying out the adhesive strength reducing step before the dividing step in the wafer dividing method of the present invention, the wafer does not bounce by the influence of the adhesive, thereby producing no chippings on the rear surfaces of the individual devices.

Since the protective tape is affixed to the front surface of the wafer and the wafer is sandwiched between the adhesive tape and the protective tape before the dividing step in the wafer dividing method of the present invention, the wafer does not bounce by the influence of the adhesive, thereby producing no chippings on the rear surfaces of the individual devices. Further, since the protective tape is affixed to the front surface of the wafer, if dust is scattered at the time when the wafer is divided along the dividing lines, the dust does not adhere to the surfaces of the devices.

DETAILED DESCRIPTION OF THE PREFERRED EMBODIMENTS

Preferred embodiments of the wafer dividing method of the present invention will be described in detail hereinunder with reference to the accompanying drawings.

Figure 1:
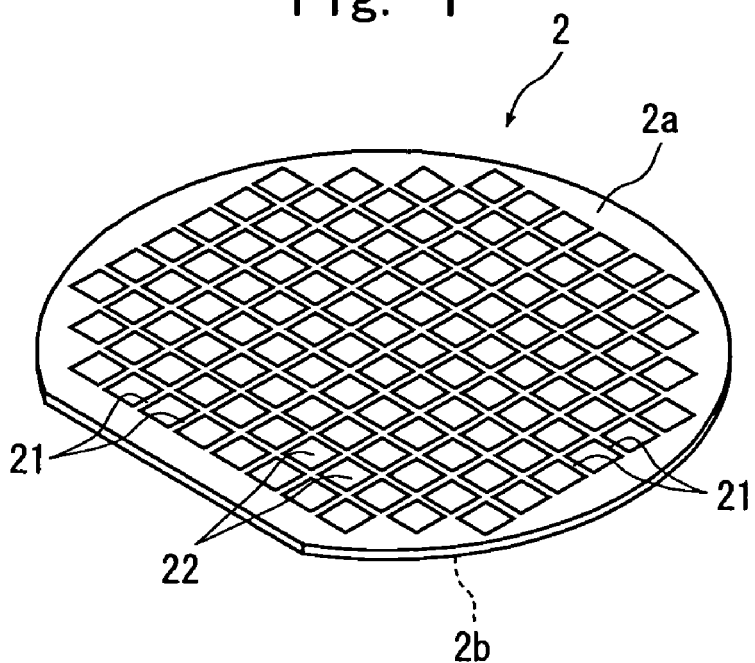
FIG. 1 is a perspective view of a semiconductor wafer to be divided into individual chips by the wafer dividing method of the present invention.

FIG. 1 is a perspective view of a semiconductor wafer as a wafer to be divided by the wafer dividing method of the present invention. The semiconductor wafer 2 shown in FIG. 1 is, for example, a silicon wafer having a thickness of 300 μm, and a plurality of dividing lines 21 are formed in a lattice pattern on the front surface 2a thereof. A device 22 such as IC or LSI is formed in a plurality of areas sectioned by the plurality of dividing lines 21 on the front surface 2a of the semiconductor wafer 2. The method of dividing this semiconductor wafer 2 into individual devices will be described hereinunder.

A first embodiment of the method of dividing the above semiconductor wafer 2 along the dividing lines 21 will be described with reference to FIGS. 2 to 10.

Figure 2:
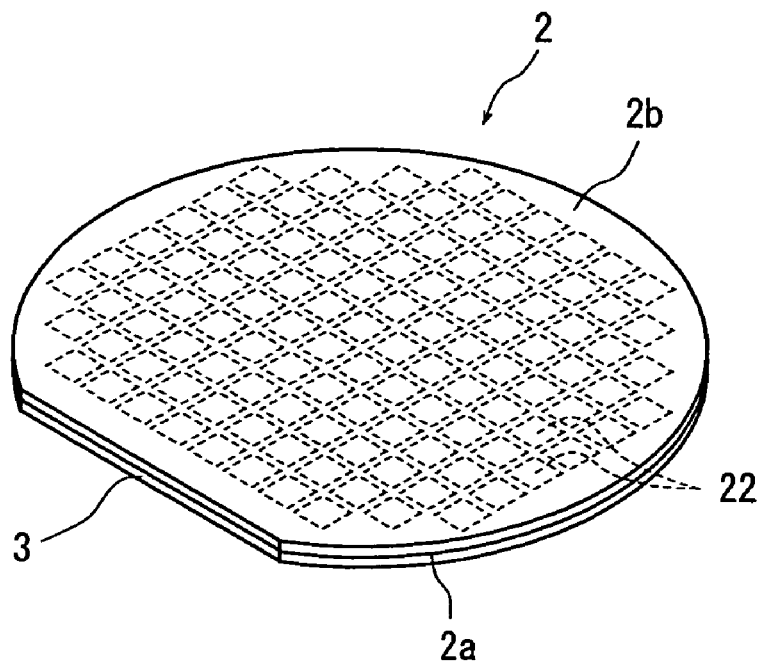
FIG. 2 is a perspective view showing a state of the semiconductor wafer shown in FIG. 1 being affixed to a protective tape on the front surface.

In the first embodiment, a protective tape 3 is affixed to the front surface 2a of the above-described semiconductor wafer 2 as shown in FIG. 2 (protective tape affixing step).

After the protective tape 3 is affixed to the front surface 2a of the semiconductor wafer 2 by carrying out the above protective tape affixing step, next comes the step of forming a deteriorated layer in the inside of the semiconductor wafer 2 along the dividing lines 21 by applying a pulse laser beam having permeability for the semiconductor wafer 2 which is, for example, a silicon wafer, from the rear surface 2b of the semiconductor wafer 2 along the dividing lines 21 so as to reduce strength along the dividing lines 21. This deteriorated layer forming step is carried out by using a laser beam processing machine 4 shown in FIG. 3. The laser beam processing machine 4 shown in FIG. 3 has a chuck table 41 for holding a workpiece, a laser beam application means 42 for applying a laser beam to the workpiece held on the chuck table 41, and an image pick-up means 43 for picking up an image of the workpiece held on the chuck table 41. The chuck table 41 is designed to suction-hold the workpiece and to be moved in a processing-feed direction indicated by an arrow X and an indexing-feed direction indicated by an arrow Y in FIG. 3 by a moving mechanism that is not shown.

The above laser beam application means 42 includes a cylindrical casing 421 arranged substantially horizontally. In the casing 421, there is installed a pulse laser beam oscillation means (not shown) which comprises a pulse laser beam oscillator composed of a YAG laser oscillator or YVO4 laser oscillator and a repetition frequency setting means. A condenser 422 for converging a pulse laser beam oscillated from the pulse laser beam oscillation means is attached to the end of the above casing 421.

The image pick-up means 43 mounted on the end portion of the casing 421 constituting the above laser beam application means 42 is constituted by an infrared illuminating means for applying infrared radiation to the workpiece, an optical system for capturing infrared radiation applied by the infrared illuminating means, and an image pick-up device (infrared CCD) for outputting an electric signal corresponding to infrared radiation captured by the optical system, in addition to an ordinary image pick-up device (CCD) for picking up an image with visible radiation in the illustrated embodiment. An image signal is supplied to a control means that is not shown.

Figure 4:
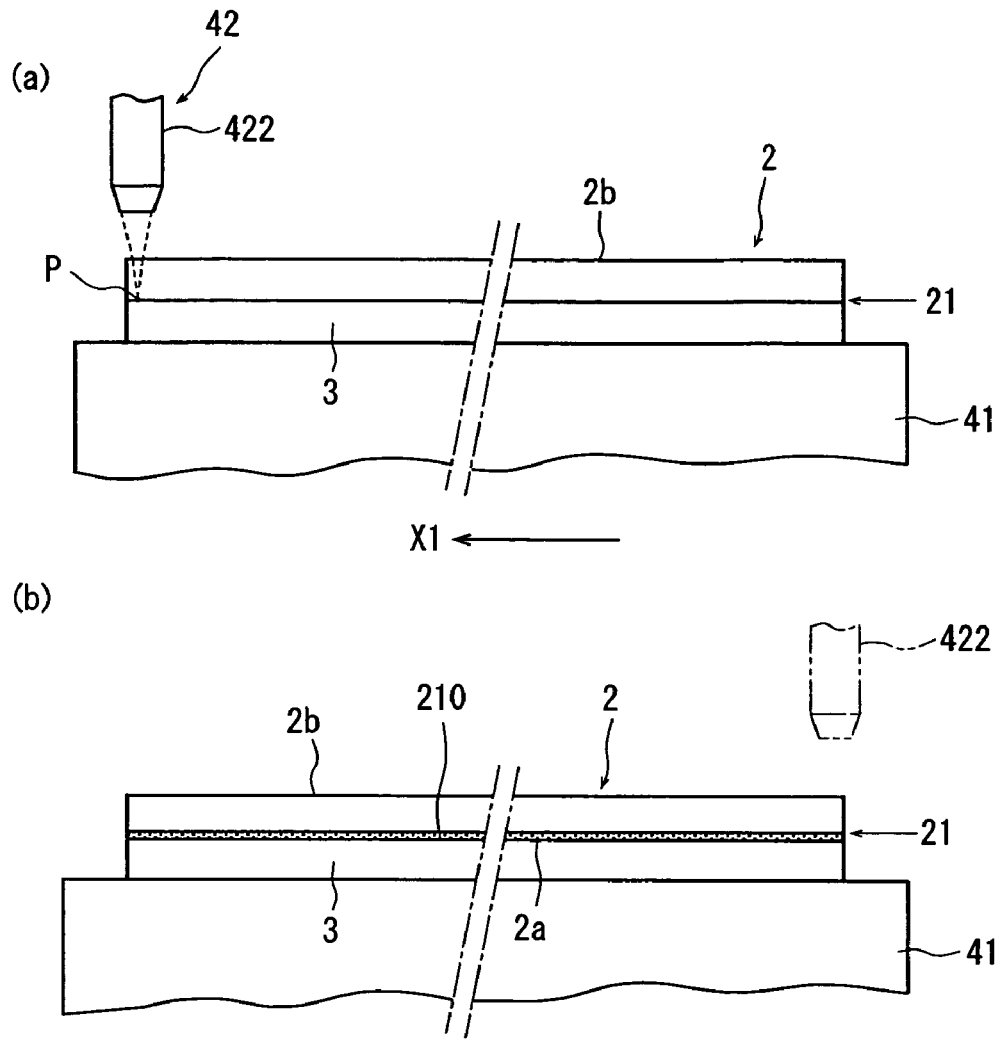
FIGS. 4(a) and 4(b) are explanatory diagrams showing the deteriorated layer forming step in the wafer dividing method of the present invention.
Figure 5:
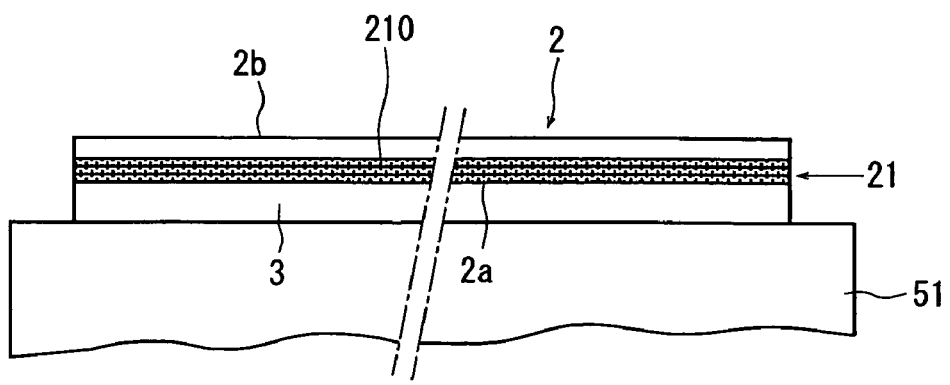
FIG. 5 is an explanatory diagram showing a state where deteriorated layers are formed in the inside of the semiconductor wafer in the deteriorated layer forming step shown in FIGS. 4(a) and 4(b)

The deteriorated layer forming step which is carried out by using the above laser beam processing machine 4 will be described with reference to FIGS. 3 to 5.

Figure 3:
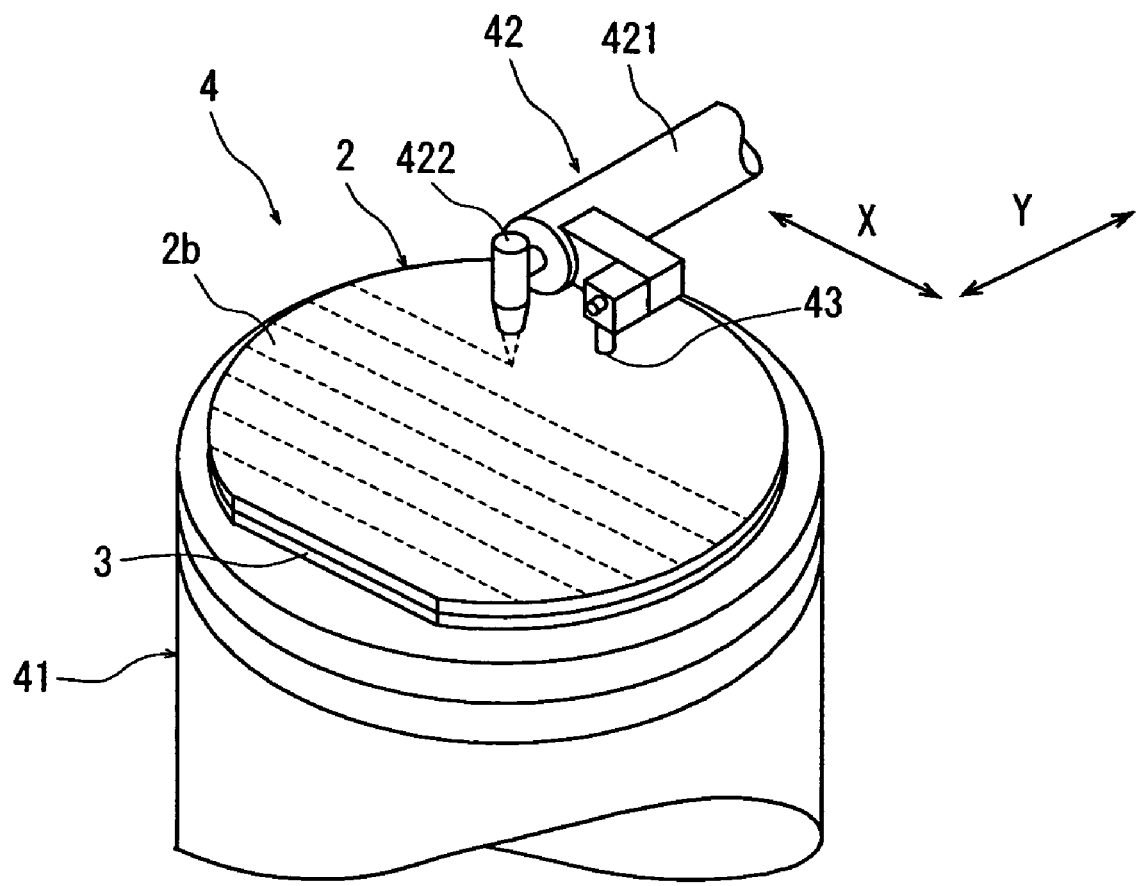
FIG. 3 is a perspective view of the principal portion of a laser beam processing machine for carrying out the deteriorated layer forming step in the wafer dividing method of the present invention.

In this deteriorated layer forming step, the protective tape 3 side of the semiconductor wafer 2 is first placed on the chuck table 41 of the laser beam processing machine 4 shown in FIG. 3 (therefore, the rear surface 2b of the semiconductor wafer 2 faces up), and the semiconductor wafer 2 is suction-held on the chuck table 41 by a suction means that is not shown. The chuck table 41 suction-holding the semiconductor wafer 2 is brought to a position right below the image pick-up means 43 by the moving mechanism that is not shown.

After the chuck table 41 is positioned right below the image pick-up means 43, alignment work for detecting the area to be processed of the semiconductor wafer 2 is carried out by the image pick-up means 43 and the control means that is not shown. That is, the image pick-up means 43 and the control means (not shown) carry out image processing such as pattern matching, etc. to align a dividing line 21 formed in a predetermined direction of the semiconductor wafer 2 with the condenser 422 of the laser beam application means 42 for applying a laser beam along the dividing line 21, thereby performing the alignment of a laser beam application position. The alignment of the laser beam application position is also carried out on dividing lines 21 formed on the semiconductor wafer 2 in a direction perpendicular to the above predetermined direction. Although the front surface 2a having the dividing lines 21 formed thereon of the semiconductor wafer 2 faces down at this point, as the image pick-up means 43 comprises the infrared illuminating means, an optical system for capturing infrared radiation and an image pick-up device (infrared CCD) for outputting an electric signal corresponding to the infrared radiation as described above, images of the dividing lines 21 can be picked up through the rear surface 2b.

After the dividing line 21 formed on the semiconductor wafer 2 held on the chuck table 41 is detected and the alignment of the laser beam application position is carried out as described above, the chuck table 41 is moved to a laser beam application area where the condenser 422 of the laser beam application means 42 for applying a laser beam is located as shown in FIG. 4(a) so as to bring one end (left end in FIG. 4(a)) of the predetermined dividing line 21 to a position right below the condenser 422 of the laser beam application means 42. The chuck table 41, that is, the semiconductor wafer 2 is then moved in the direction indicated by the arrow X1 in FIG. 4(a) at a predetermined feed rate while a pulse laser beam having permeability for a silicon wafer is applied from the condenser 422. When the application position of the condenser 422 reaches the other end of the dividing line 21 as shown in FIG. 4(b), the application of the pulse laser beam is suspended and the movement of the chuck table 41, that is, the semiconductor wafer 2 is stopped. In this deteriorated layer forming step, the focal point P of the pulse laser beam is set to a position near the front surface 2a (undersurface) of the semiconductor wafer 2. As a result, a deteriorated layer 210 is exposed to the front surface 2a (undersurface) of the semiconductor wafer 2 and formed from the front surface 2a toward the inside. This deteriorated layer 210 is formed as a molten and re-solidified layer.

The processing conditions in the above deteriorated layer forming step are set as follows, for example.

Light source: LD excited Q switch Nd:YVO4 laser
Wavelength: pulse laser beam having a wavelength of 1,064 nm
Pulse output: 10 μJ
Focal spot diameter: 1 μm
Repetition frequency: 100 kHz
Processing-feed rate: 100 mm/sec When the semiconductor wafer 2 is thick, as shown in FIG. 5, the above-described deteriorated layer forming step is carried out several times by changing the focal point P stepwise so as to form a plurality of deteriorated layers 210. For example, as the thickness of the deteriorated layer formed once under the above processing conditions is about 50 μm, the above deteriorated layer forming step is carried out three times to form deteriorated layers 210 having a total thickness of 150 μm. In the case of a wafer 2 having a thickness of 300 μm, six deteriorated layers 210 may be formed from the front surface 2a to the rear surface 2b along the dividing lines 21 in the inside of the semiconductor wafer 2. Further, the above deteriorated layer 210 may be formed only in the inside of the semiconductor wafer 2 without being exposed to the front surface 2a and the rear surface 2b.

After the above deteriorated layer forming step is carried out along all the dividing lines 21 formed in the predetermined direction of the semiconductor wafer 2 as described above, the chuck table 41 is turned at 90° to carry out the above deteriorated layer forming step along dividing lines 21 formed in a direction perpendicular to the above predetermined direction.

Figure 6:
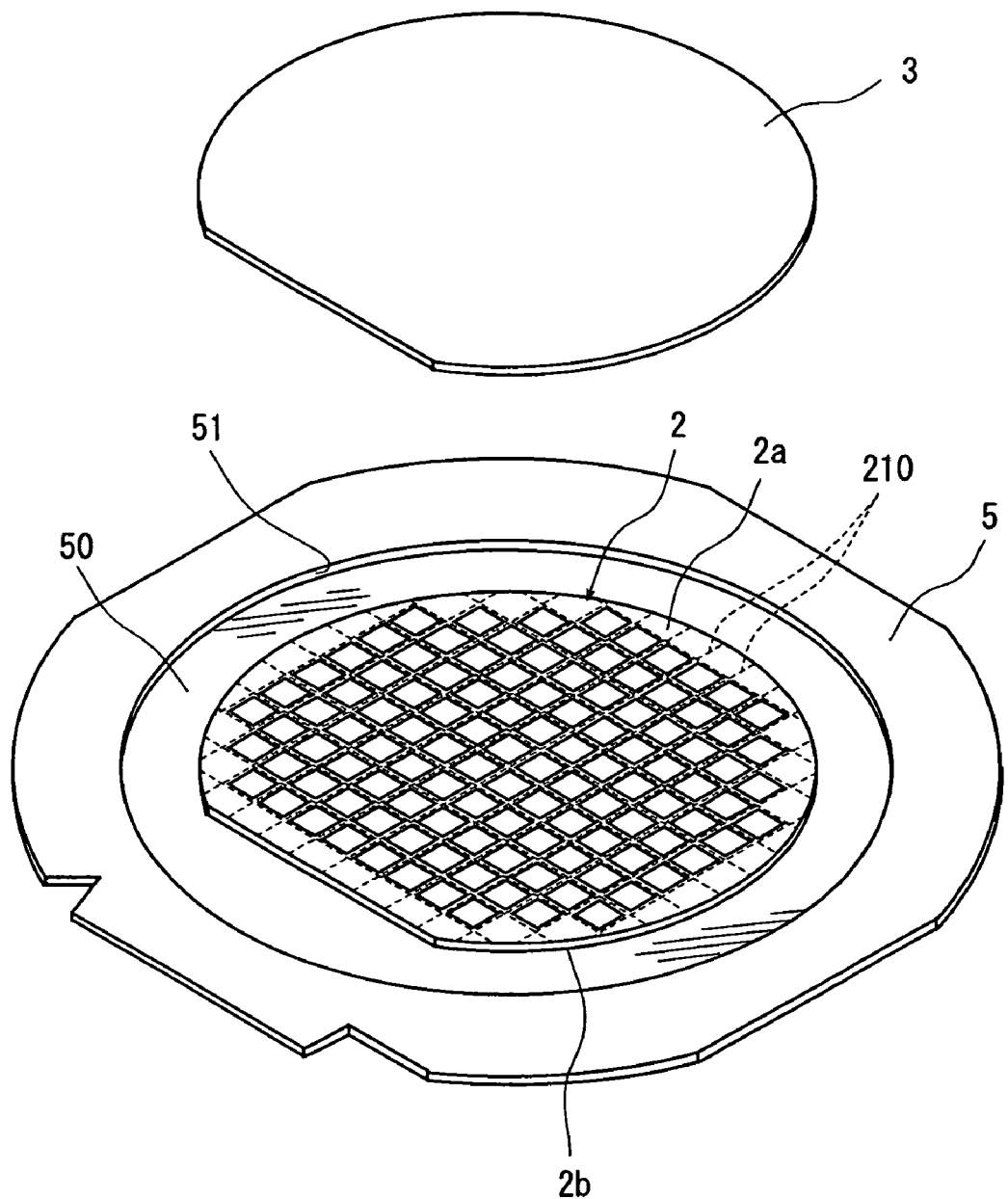
FIG. 6 is an explanatory diagram showing the wafer supporting step in the wafer dividing method of the present invention.

As described above, after the above deteriorated layer forming step is carried out along all the dividing lines 21 formed on the semiconductor wafer 2, next comes a wafer supporting step for putting the rear surface of the wafer on the surface of an adhesive tape which is mounted on an annular frame and whose adhesive strength is reduced by applying ultraviolet radiation thereto. That is, as shown in FIG. 6, the rear surface 2b of the semiconductor wafer 2 is put on the surface of the adhesive tape 50 whose outer peripheral portion is mounted on the annular frame 5 so as to cover its inner opening 51. Then, the protective tape 3 is removed from the front surface 2a of the semiconductor wafer 2. The adhesive tape 50 is prepared, for example, by applying an adhesive whose adhesive strength is reduced by applying ultraviolet radiation thereto to the surface of a 70 μm-thick sheet backing made of a synthetic resin such as polyvinyl chloride (PVC) or the like. As the adhesive tape having an adhesive whose adhesive strength is reduced by applying ultraviolet radiation thereto may be used the D series tape manufactured and marketed by Lintec Corporation, the UC series tape manufactured and marketed by The Furukawa Electric Co., Ltd. and the FSL-N400 series tape manufactured and marketed by Sumitomo Bakelite Co., Ltd.

Figure 7:
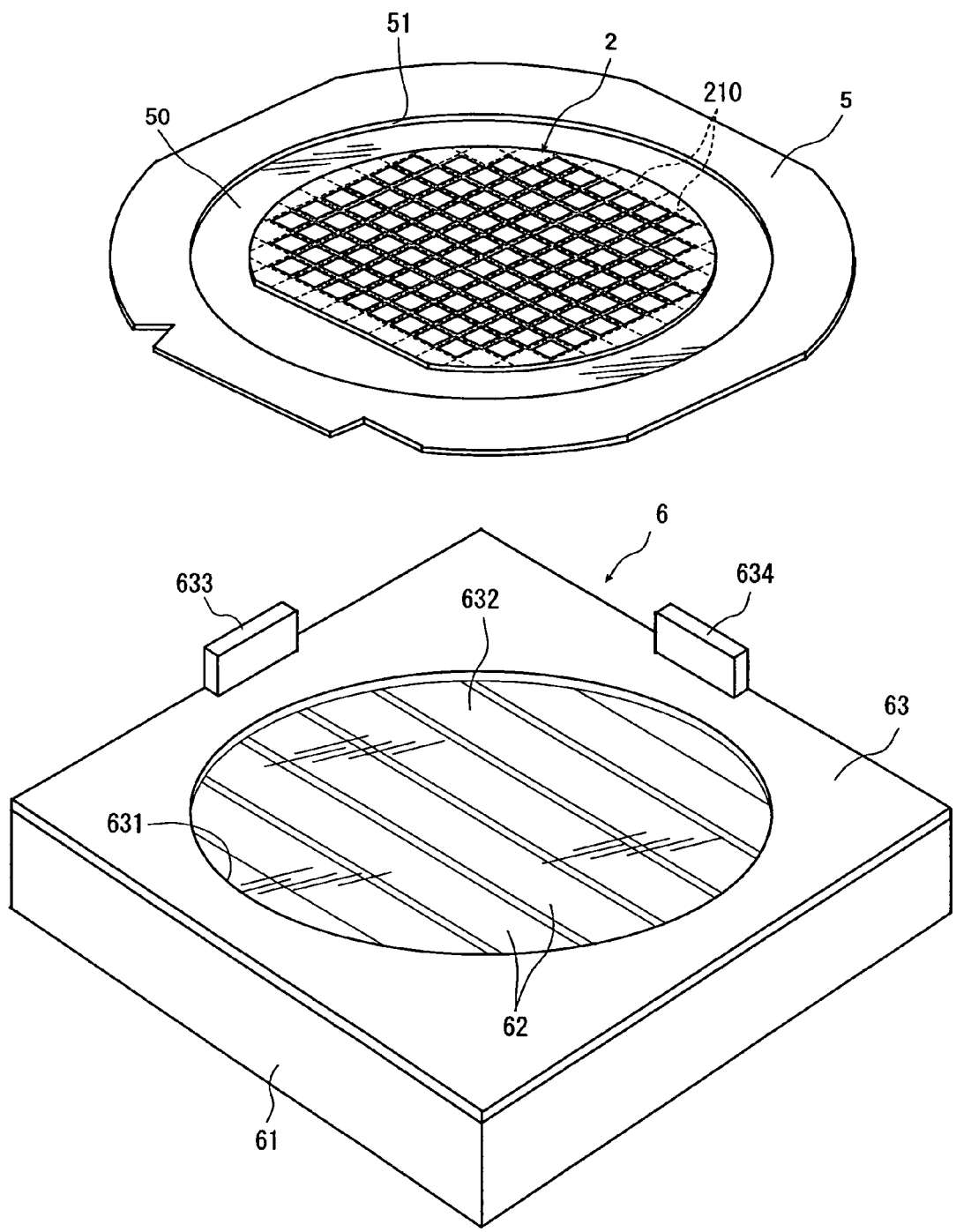
FIG. 7 is a perspective view of an ultraviolet illuminator for carrying out the adhesive strength reducing step in the wafer dividing method of the present invention.
Figure 8:
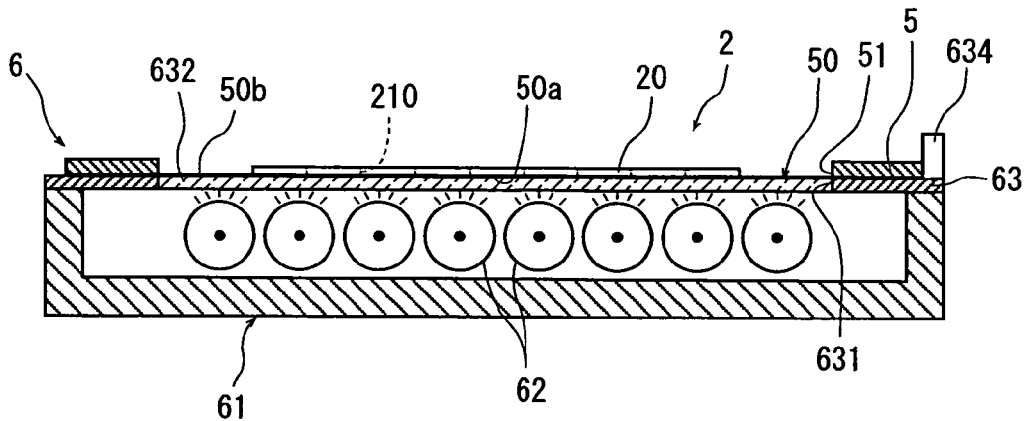
FIG. 8 is an explanatory diagram showing the adhesive strength reducing step in the wafer dividing method of the present invention.

After the above wafer supporting step, next comes the step of reducing the adhesive strength of the adhesive tape 50 to which the semiconductor wafer 2 has affixed, where the deteriorated layer 210 has been formed along the dividing lines 21 by applying ultraviolet radiation thereto along the dividing lines 21. This adhesive strength reducing step is carried out by using an ultraviolet illuminator 6 shown in FIG. 7 and FIG. 8. The ultraviolet illuminator 6 shown in FIG. 7 and FIG. 8 is composed of a substantially rectangular parallelepiped lamp housing 61 which is open at the top, a plurality of ultraviolet lamps 62 installed in the lamp housing 61 and a frame holding plate 63 mounted on the top surface of the lamp housing 61. An opening 631 corresponding to the opening 51 of the annular frame 5 is formed in the frame holding plate 63. Transparent glass 632 is fitted in the opening 631. Two positioning members 633 and 634 for restricting the periphery of the annular frame 5 are provided on the top surface of the frame holding plate 63.

The annular frame 5 supporting the semiconductor wafer 2 (the deteriorated layer 210 is formed along the dividing lines 21) through the adhesive tape 50 is placed on the frame holding plate 63 of the ultraviolet illuminator 6 constituted as described above. At this point, the annular frame 5 is positioned at a predetermined location by bringing the periphery of the annular frame 5 into contact with the two positioning members 633 and 634. After the annular frame 5 is thus positioned at the predetermined location of the frame holding plate 63, the opening 631 formed in the frame holding plate 63 is aligned with the opening 51 of the annular frame 5, as shown in FIG. 8. Then, the ultraviolet lamps 62 are turned on as shown in FIG. 8. By turning on the ultraviolet lamps 62, ultraviolet radiation is applied to the adhesive tape 50 mounted on the annular frame 5 through the transparent glass 632. As a result, the adhesive of the adhesive tape 50 is cured to reduce its adhesive strength.

After the above adhesive strength reducing step, next comes the step of dividing the semiconductor wafer 2 into individual devices along the dividing lines 21 where the deteriorated layer 210 has been formed by exerting external force to the semiconductor wafer 2 mounted on the adhesive tape 50 whose adhesive strength has been reduced. This dividing step is carried out by using a dividing apparatus 7 shown in FIG. 9.

Figure 9:
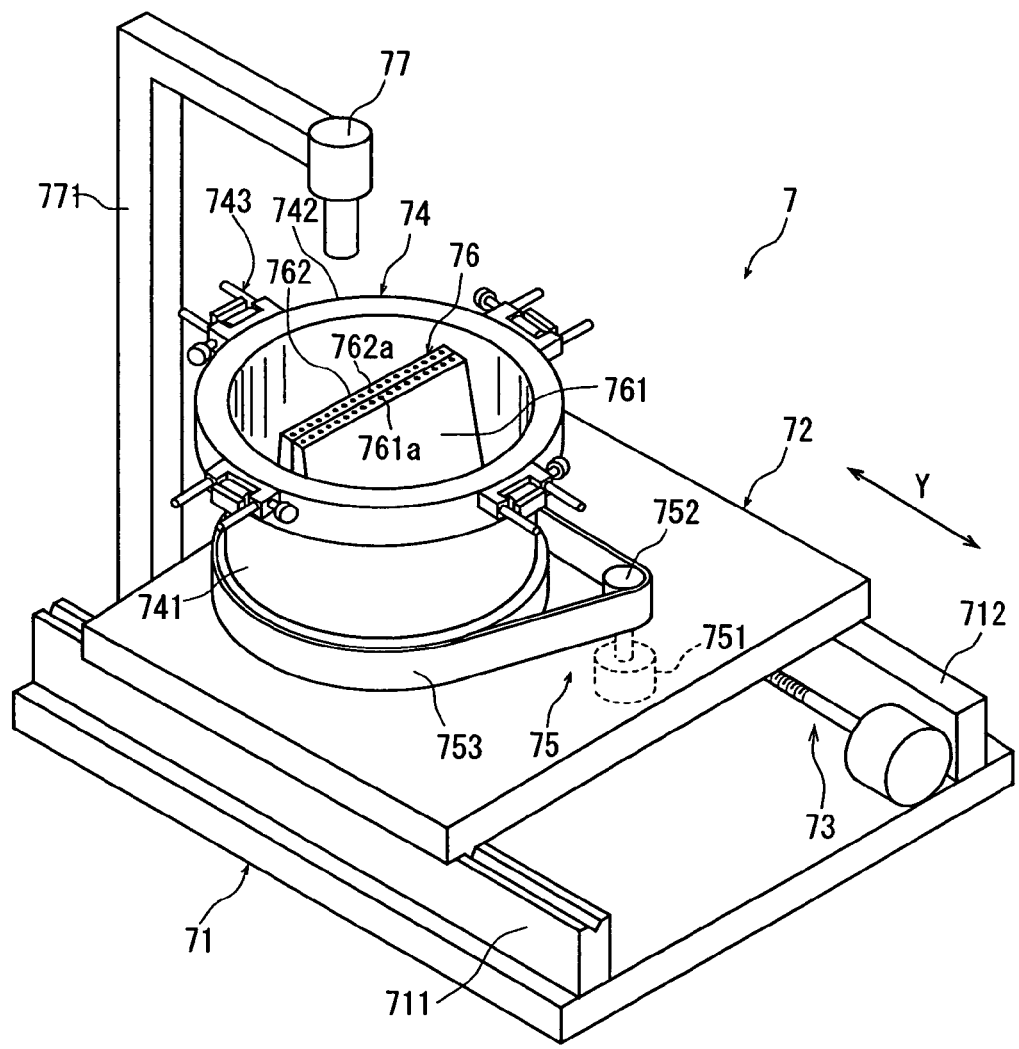
FIG. 9 is a perspective view of a dividing apparatus for carrying out the dividing step in the wafer dividing method of the present invention.
Figure 10:
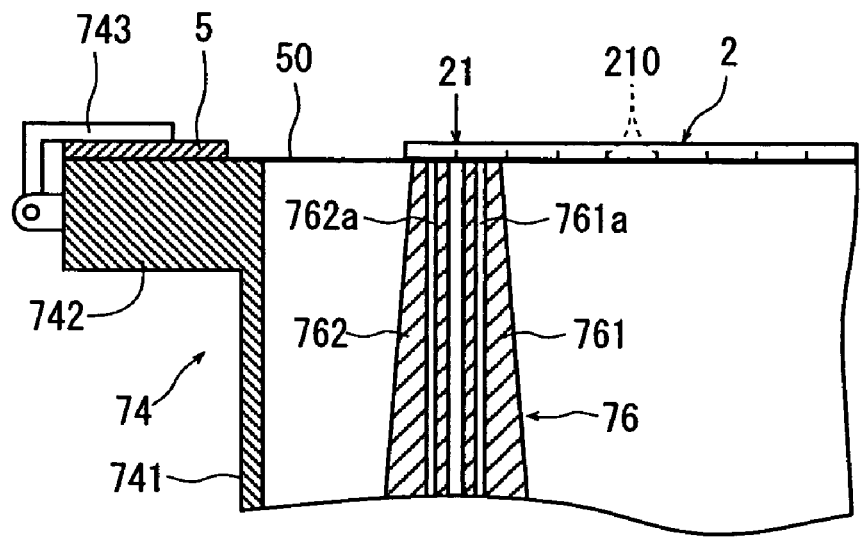
FIGS. 10(a) and 10(b) are explanatory diagrams showing the dividing step in the wafer dividing method of the present invention.
Figure 10:
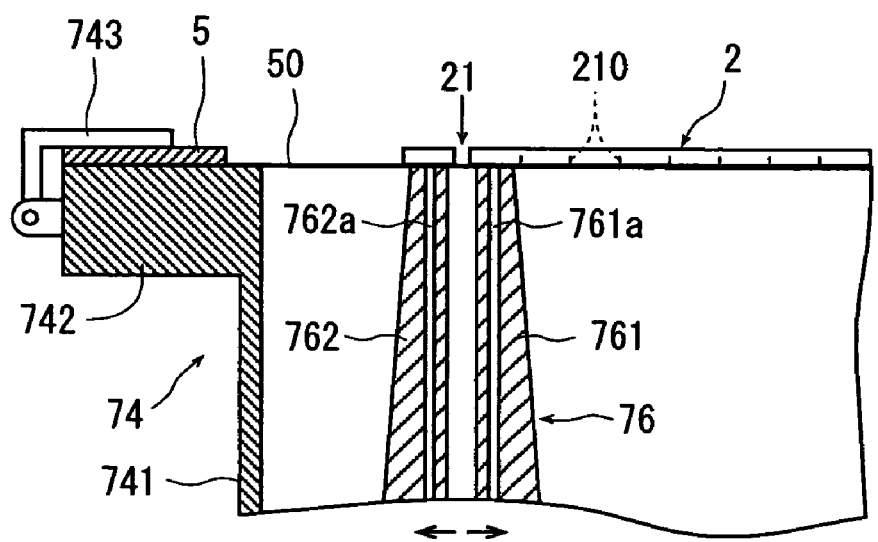

The wafer dividing apparatus 7 shown in FIG. 9 has a base 71 and a movable table 72 which is mounted on the base 71 in such a manner that it can move in the direction indicated by the arrow Y. The base 71 is rectangular and provided with two guide rails 711 and 712 which are installed on top of the both side portions of the base 71 and parallel to each other in the direction indicated by the arrow Y. The above movable table 72 is movably mounted on the two guide rails 711 and 712. This movable table 72 is moved in the direction indicated by the arrow Y by a moving means 73. A frame holding means 74 for holding the above annular frame 5 is mounted on the movable table 72. The frame holding means 74 is constituted by a cylindrical body 741, an annular frame holding member 742 mounted on the upper end of the body 741, and a plurality of clamps 743 as a fixing means arranged around the frame holding member 742. The frame holding means 74 constituted as described above fixes the annular frame 5 on the frame holding member 742 by the clamps 743. The wafer dividing apparatus 7 shown in FIG. 9 has a turning means 75 for turning the above frame holding means 74. This turning means 75 is constituted by a pulse motor 751 mounted on the above movable table 72, a pulley 752 connected to the rotary shaft of the pulse motor 751, and an endless belt 753 wound round the pulley 752 and the cylindrical body 741. The turning means 75 constituted as described above turns the frame holding means 74 through the pulley 752 and the endless belt 753 by driving the pulse motor 751.

The wafer dividing apparatus 7 shown in FIG. 9 comprises a tensile force-exerting means 76 for exerting tensile force in a direction perpendicular to the dividing lines 21 to the semiconductor wafer 2 supported to the annular frame 5 held on the above annular frame holding member 742 through the adhesive tape 50. The tensile force-exerting means 76 is installed within the body 741 of the frame holding means 74. This tensile force-exerting means 76 has a first suction-holding member 761 and a second suction-holding member 762 both having a rectangular holding surface prolonged in the direction perpendicular to the direction indicated by the arrow Y. A plurality of suction holes 761a are formed in the first suction-holding member 761 and a plurality of suction holes 762a are formed in the second suction-holding member 762. The plurality of suction holes 761a and the plurality of suction holes 762a are communicated with a suction means that is not shown. The first suction-holding member 761 and the second suction-holding member 762 can be respectively moved in the direction indicated by the arrow Y by a moving means that is not shown.

The wafer dividing apparatus 7 shown in FIG. 9 has a detection means 77 for detecting the dividing lines 21 of the semiconductor wafer 2 supported to the annular frame 5 held on the above annular frame holding member 742 through the adhesive tape 50. The detection means 77 is attached to an L-shaped support pillar 771 installed on the base 71. This detection means 77 is constituted by an optical system and an image pick-up device (CCD), and is positioned above the above tensile force-exerting means 76. The detection means 77 constituted as described above picks up an image of a dividing line 21 of the semiconductor wafer 2 supported to the annular frame 5 held on the above annular frame holding member 742 through the adhesive tape 50, converts it into an electrical signal and supplies it to the control means that is not shown.

The dividing step which is carried out by using the above-described dividing apparatus 7 will be described with reference to FIG. 9 and FIGS. 10(a) and 10(b).

The annular frame 5 supporting the semiconductor wafer 2 mounted on the adhesive tape 50 which has been subjected to the above adhesive strength reducing step is placed on the frame holding member 742, and fixed on the frame holding member 742 by the clamps 743, as shown in FIG. 10(a). Thereafter, the moving means 73 is activated to move the movable table 72 in the direction indicated by the arrow Y (see FIG. 9) so as to bring one dividing line 21 (the most left dividing line in the illustrated embodiment) formed in the predetermined direction of the semiconductor wafer 2 to a position between the holding surface of the first suction-holding member 761 and the holding surface of the second suction-holding member 762 constituting the tensile force-exerting means 76, as shown in FIG. 10(a). At this point, an image of the dividing line 21 is picked up by the detection means 77 and a position of the dividing line 21 between the holding surface of the first suction-holding member 761 and the holding surface of the second suction-holding member 762 is carried out. After the dividing line 21 is thus positioned between the holding surface of the first suction-holding member 761 and the holding surface of the second suction-holding member 762, the suction means (not shown) is activated to exert negative pressure to the suction holes 761a and 762a to suction-hold the semiconductor wafer 2 on the holding surface of the first suction-holding member 761 and the holding surface of the second suction-holding member 762 through the adhesive tape 50 (holding step).

After the above holding step, the moving means (not shown) constituting the tensile force-exerting means 76 is activated to move the first suction-holding member 761 and the second suction-holding member 762 in the directions opposite to each other, as shown in FIG. 10(b). As a result, tensile force acts, in a direction perpendicular to the dividing line 21, on the dividing line 21 positioned between the holding surface of the first suction-holding member 761 and the holding surface of the second suction-holding member 762, thereby dividing the semiconductor wafer 2 along the dividing line 21 (dividing step). By carrying out this dividing step, the adhesive tape 50 is slightly stretched. In this dividing step, as the strength of the semiconductor wafer 2 has been reduced by the formation of the deteriorated layer 210 along the dividing line 21, the semiconductor wafer 10 can be divided along the dividing line 21 by moving the first suction-holding member 761 and the second suction-holding member 762 about 0.5 mm in the directions opposite to each other.

After the dividing step for dividing the semiconductor wafer 2 along the dividing line 21 formed in the predetermined direction as described above, the suction-holding of the semiconductor wafer 2 on the first suction-holding member 761 and the second suction-holding member 762 is cancelled. Thereafter, the moving means 73 is activated to move the movable table 72 by a distance corresponding to the interval between the dividing lines 21 in the direction (see FIG. 9) indicated by the arrow Y to bring a dividing line 21 next to the dividing line 21 which has been subjected to the above dividing step to a position between the holding surface of the first suction-holding member 761 and the holding surface of the second suction-holding member 762 constituting the tensile force-exerting means 76. Thereafter, the above holding step and the dividing step are carried out.

After the above holding step and the dividing step are carried out on all the dividing lines 21 formed in the predetermined direction as described above, the turning means 75 is activated to turn the frame holding means 74 at 90°. As a result, the semiconductor wafer 2 held on the frame holding member 742 of the frame holding means 74 is also turned at 90° so that dividing lines 21 formed in a direction perpendicular to the dividing lines 21 which have been formed in the predetermined direction and subjected to the above dividing step become parallel to the holding surface of the first suction-holding member 761 and the holding surface of the second suction-holding member 762. Subsequently, the above holding step and the dividing step are carried out on all the dividing lines 21 formed in the direction perpendicular to the dividing lines 21 which have been subjected to the above dividing step to divide the semiconductor wafer 2 into individual devices along the dividing lines 21.

Since the adhesive of the adhesive tape 50 has already been cured by the above adhesive strength reducing step when the above dividing step is carried out, the semiconductor wafer 2 does not bounce by the influence of the adhesive, thereby producing no chippings on the rear surfaces of the individual devices.

Next, a second embodiment of the method of dividing the semiconductor wafer 2 shown in FIG. 1 along the dividing lines 21 will be described hereinunder.

Figure 11:
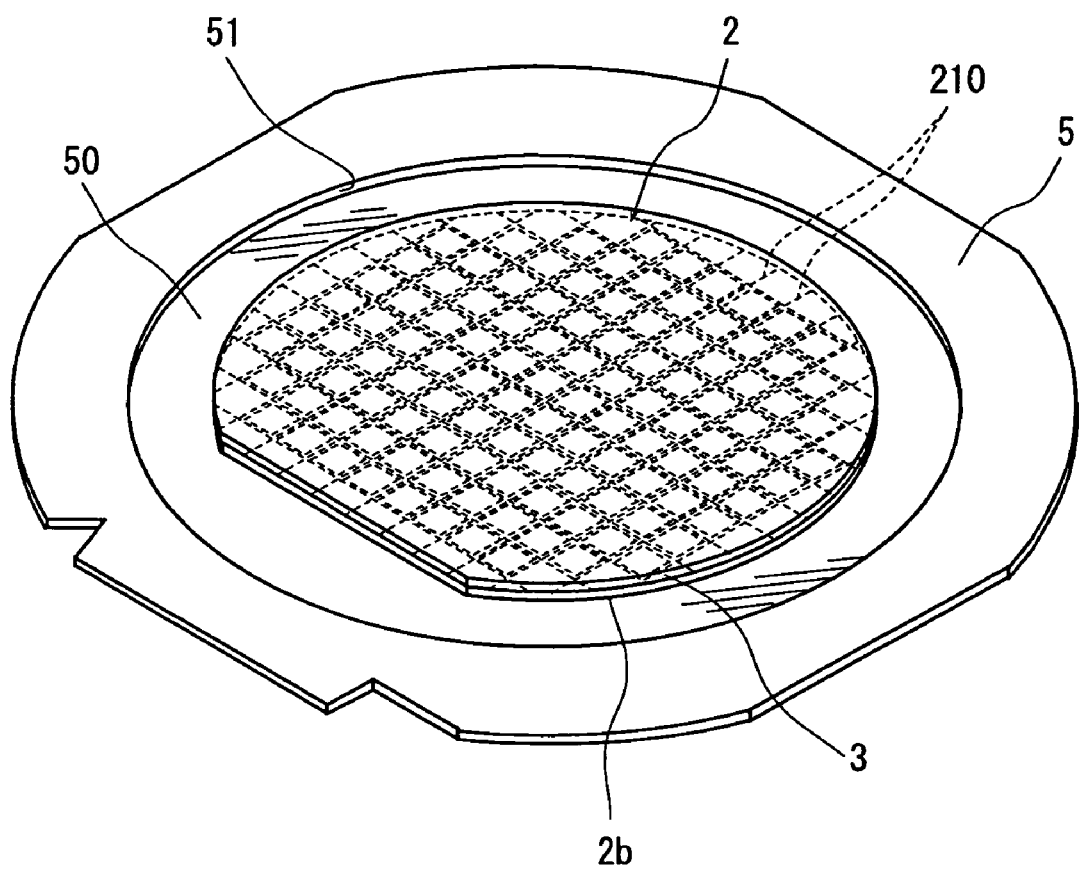
FIG. 11 is an explanatory diagram showing another embodiment of the wafer supporting step in the wafer dividing method of the present invention.

In the second embodiment, like the above first embodiment, the above protective tape affixing step and the deteriorated layer forming step are carried out. The wafer supporting step for putting the rear surface 2b of the semiconductor wafer 2 on the surface of the adhesive tape 50 mounted on the annular frame 5 as shown in FIG. 11 is then carried out. In the wafer supporting step in the second embodiment, the protective tape 3 affixed to the front surface 2a of the semiconductor wafer 2 does not fall away. The above-mentioned protective tape affixing step may be carried out after the wafer supporting step. That is, after the above deteriorated layer forming step is carried out without bonding the protective tape 3 to the front surface 2a of the semiconductor wafer 2, the wafer supporting step for putting the rear surface 2b of the semiconductor wafer 2 which has been subjected to the deteriorated layer forming step on the surface of the adhesive tape 50 mounted on the annular frame 5 is carried out. The protective tape 3 is then affixed to the front surface 2a of the semiconductor wafer 2 affixed to the surface of the adhesive tape 50 mounted on the annular frame 5. In the second embodiment, the adhesive applied to the surface of the adhesive tape 50 does not always need to be an adhesive whose strength is reduced by applying ultraviolet radiation thereto.

Figure 12:
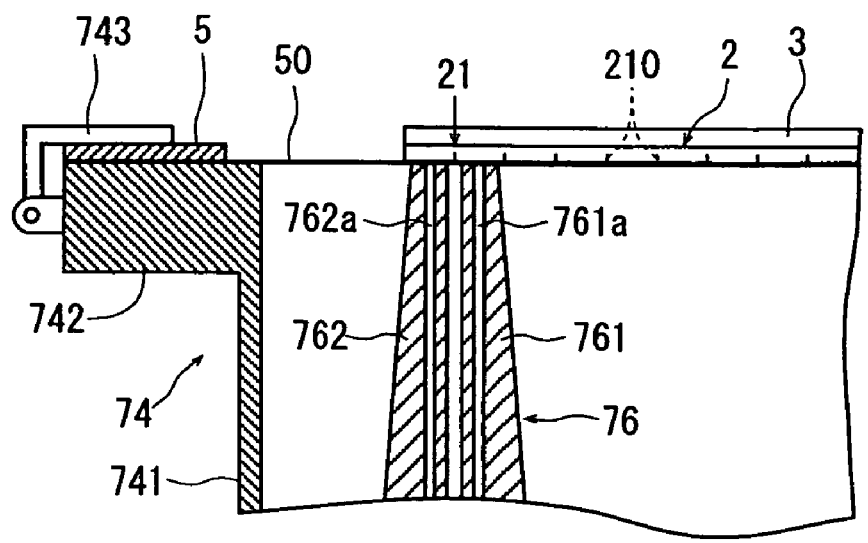
FIGS. 12(a) and 12(b) are explanatory diagrams showing another embodiment of the wafer dividing step in the wafer dividing method of the present invention.
Figure 12:
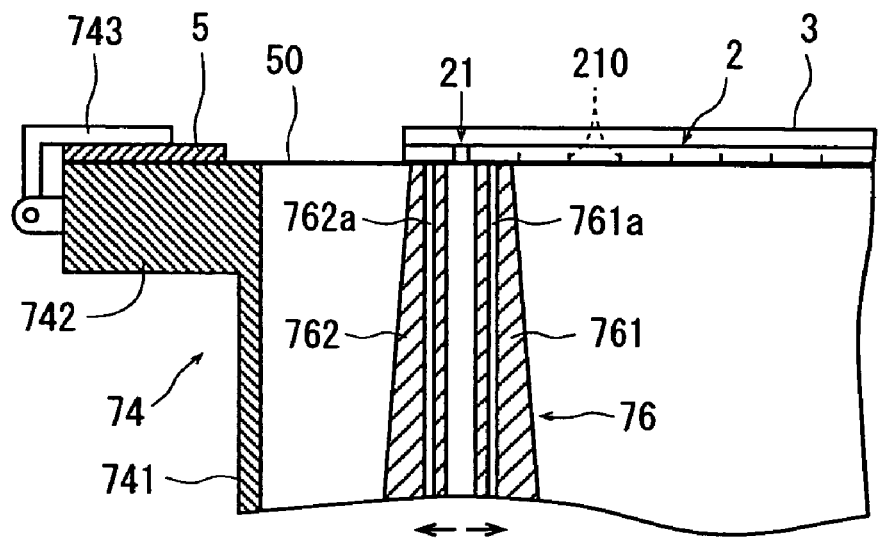

Next comes the step of dividing the semiconductor wafer 2 into individual devices along the dividing lines 21 where the deteriorated layer 210 has been formed by exerting external force to the semiconductor wafer 2 in a state where the protective tape 3 is affixed to the front surface 2a of the semiconductor wafer 2 affixed to the surface of the adhesive tape 50 mounted on the annular frame 5. This dividing step is carried out by using the dividing apparatus 7 shown in FIG. 9. That is, the annular frame 5 supporting the semiconductor wafer 2 affixed to the adhesive tape 50 is placed on the frame holding member 742 as shown in FIG. 12(a), and fixed on the frame holding member 742 by the clamps 743. After the positioning of the holding surface of the first suction-holding member 761 and the holding surface of the second suction-holding member 762 is carried out as in the above dividing step, the suction means (not shown) is activated to exert negative pressure to the suction holes 761a and 762a so as to suction-hold the semiconductor wafer 2 on the holding surface of the first suction-holding member 761 and the holding surface of the second suction-holding member 762 through the adhesive tape 50. Thereafter, the moving means (not shown) constituting the tensile force-exerting means 76 is activated to move the first suction-holding member 761 and the second suction-holding member 762 in the directions opposite to each other as shown in FIG. 12(b), thereby dividing the semiconductor wafer 2 along the dividing line 21. By carrying out this dividing step, the adhesive tape 50 and the protective tape 3 are slightly stretched. In this dividing step, as the protective tape 3 is affixed to the front surface 2a of the semiconductor wafer 2 and the semiconductor wafer 2 is sandwiched between the adhesive tape 50 and the protective tape 3, the semiconductor wafer 2 does not bounce by the influence of the adhesive, thereby producing no chippings on the rear surfaces of the individual devices. Since the protective tape 3 is affixed to the front surface 2a of the semiconductor wafer 2, if dust is scattered at the time when the semiconductor wafer 2 is divided along the dividing lines 21, it does not adhere to the surfaces of the devices.

A third embodiment of the method of dividing the semiconductor wafer 2 shown in FIG. 1 along the dividing lines 21 will be described hereinunder.

The third embodiment is a dividing method which is a combination of the above first embodiment and the above second embodiment. That is, after the protective tape affixing step and the deteriorated layer forming step in the first and second embodiments, the wafer supporting step in the second embodiment is carried out. The adhesive strength reducing step is carried out in a state where the protective tape 3 is affixed to the front surface 2a of the semiconductor wafer 2 affixed to the surface of the adhesive tape 50 coated with an adhesive which is mounted on the annular frame 5 and whose strength is reduced by applying ultraviolet radiation thereto. Then, the dividing step in the second embodiment is carried out. Since the protective tape 3 has been affixed to the front surface 2a of the semiconductor wafer 2 and the adhesive of the adhesive tape 50 has been cured at the time when the dividing step is carried out in the third embodiment, the semiconductor wafer 2 is more stable than in the first embodiment and the second embodiment, and does not bounce by the influence of the adhesive, thereby producing no chippings on the rear surfaces of the individual devices. Further, since the protective tape 3 is affixed to the front surface 2a of the semiconductor wafer 2, if dust is scattered at the time when the semiconductor wafer 2 is divided along the dividing lines 21, this dust does not adhere to the surfaces of the devices.

What is claimed is:

1. A method of dividing a wafer having a plurality of dividing lines which are formed in a lattice pattern on the front surface and devices which are formed in a plurality of areas sectioned by the plurality of dividing lines, into individual devices along the dividing lines, comprising:

a deteriorated layer forming step for forming a deteriorated layer in the inside of the wafer along the dividing lines by applying a laser beam of a wavelength having permeability for the wafer along the dividing lines;

a wafer supporting step for putting the rear surface of the wafer on the surface of an adhesive tape which is mounted on an annular frame and whose adhesive strength is reduced by applying ultraviolet radiation thereto;

an adhesive strength reducing step for reducing the adhesive strength of the adhesive tape by applying ultraviolet radiation to the adhesive tape mounting the wafer where the deteriorated layer has been formed along the dividing lines; and a dividing step for dividing the wafer into individual devices along the dividing lines where the deteriorated layer has been formed by exerting external force to the wafer affixed to the adhesive tape whose adhesive strength has been reduced after the adhesive strength reducing step.

2. A method of dividing a wafer having a plurality of dividing lines which are formed in a lattice pattern on the front surface and devices which are formed in a plurality of areas sectioned by the plurality of dividing lines, into individual devices along the dividing lines, comprising:

a deteriorated layer forming step for forming a deteriorated layer in the inside of the wafer along the dividing lines by applying a laser beam of a wavelength having permeability for the wafer along the dividing lines;

a wafer supporting step for putting the rear surface of the wafer on the surface of an adhesive tape which is mounted on an annular frame;

a protective tape affixing step for affixing a protective tape to the front surface of the wafer before or after the wafer supporting step; and a dividing step for dividing the wafer into individual devices along the dividing lines where the deteriorated layer has been formed by exerting external force to the wafer affixed to the adhesive tape.

3. A method of dividing a wafer having a plurality of dividing lines which are formed in a lattice pattern on the front surface and devices which are formed in a plurality of areas sectioned by the plurality of dividing lines, into individual devices along the dividing lines, comprising:

a deteriorated layer forming step for forming a deteriorated layer in the inside of the wafer along the dividing lines by applying a laser beam of a wavelength having permeability for the wafer along the dividing lines;

a wafer supporting step for putting the rear surface of the wafer on the surface of an adhesive tape which is mounted on an annular frame and whose adhesive strength is reduced by applying ultraviolet radiation thereto;

a protective tape affixing step for affixing a protective tape to the front surface of the wafer before or after the wafer supporting step;

an adhesive strength reducing step for reducing the adhesive strength of the adhesive tape by applying ultraviolet radiation to the adhesive tape affixing to the wafer where the deteriorated layer has been formed along the dividing lines; and a dividing step for dividing the wafer into individual devices along the dividing lines where the deteriorated layer has been formed by exerting external force to the wafer affixed to the adhesive tape whose adhesive strength has been reduced after the adhesive strength reducing step.

* * * * *